(12) United States Patent
Gondhalekar et al.

(10) Patent No.: US 7,141,138 B2
(45) Date of Patent: Nov. 28, 2006

(54) GAS DELIVERY SYSTEM FOR SEMICONDUCTOR PROCESSING

(75) Inventors: Sudhir Gondhalekar, Fremont, CA (US); Padmanabhan Krishnaraj, San Francisco, CA (US); Tom K. Cho, Palo Alto, CA (US); Muhammad Rasheed, Fremont, CA (US); Hemant Mungekar, San Jose, CA (US); Thanh N. Pham, San Jose, CA (US); Zhong Qiang Hua, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 224 days.

(21) Appl. No.: 10/630,989

(22) Filed: Jul. 28, 2003

(65) Prior Publication Data
US 2004/0126952 A1    Jul. 1, 2004

Related U.S. Application Data

(60) Provisional application No. 60/410,353, filed on Sep. 13, 2002.

(51) Int. Cl.
*H01L 21/306* (2006.01)
*C23C 16/00* (2006.01)
*C23F 1/00* (2006.01)

(52) U.S. Cl. .................... 156/345.33; 118/715
(58) Field of Classification Search ......... 156/345.33, 156/345.34; 118/715, 724, 726, 717; 204/298.07, 204/298.33
See application file for complete search history.

(56) References Cited

U.S. PATENT DOCUMENTS

| 5,120,930 A | * | 6/1992 | Sanders et al. ......... 219/121.5 |
| 6,200,911 B1 | * | 3/2001 | Narwankar et al. ......... 438/758 |
| 6,545,419 B1 | * | 4/2003 | Vella ..................... 315/111.21 |
| 6,657,213 B1 | * | 12/2003 | Orsini et al. ............ 250/504 R |
| 6,755,355 B1 | * | 6/2004 | Whittaker .................. 239/132 |
| 6,835,944 B1 | * | 12/2004 | Orsini et al. ............ 250/504 R |
| 2004/0035531 A1 | * | 2/2004 | Donohoe et al. ....... 156/345.33 |

FOREIGN PATENT DOCUMENTS

| JP | 08097188 A | * | 4/1996 |
| JP | 09134880 A | * | 5/1997 |
| JP | 11354062 A | * | 12/1999 |
| JP | 2004107686 A | * | 4/2004 |

* cited by examiner

*Primary Examiner*—Parviz Hassanzadeh
*Assistant Examiner*—Rakesh K Dhingra
(74) *Attorney, Agent, or Firm*—Townsend and Townsend and Crew LLP

(57) ABSTRACT

The present invention is directed to improving defect performance in semiconductor processing systems. In specific embodiments, an apparatus for processing semiconductor substrates comprises a chamber defining a processing region therein, and a substrate support disposed in the chamber to support a semiconductor substrate. At least one nozzle extends into the chamber to introduce a process gas into the chamber through a nozzle opening. The apparatus comprises at least one heat shield, each of which is disposed around at least a portion of one of the at least one nozzle. The heat shield has an extension which projects distally of the nozzle opening of the nozzle and which includes a heat shield opening for the process gas to flow therethrough from the nozzle opening. The heat shield decreases the temperature of nozzle in the processing chamber for introducing process gases therein to reduce particles.

16 Claims, 4 Drawing Sheets

GAS DELIVERY SYSTEM FOR SEMICONDUCTOR PROCESSING

CROSS-REFERENCES TO RELATED APPLICATIONS

This application is based on and claims the benefit of U.S. Provisional Patent Application No. 60/410,353, filed on Sep. 13, 2002, the entire disclosure of which is incorporated herein by reference.

BACKGROUND OF THE INVENTION

This invention relates generally to semiconductor processing and, more particularly, to a gas delivery system for a chemical vapor deposition chamber suitable for high density plasma gapfill processing.

The fabrication of integrated circuits (ICs) involves performing a number of processes on the substrate, including the deposition of layers on the substrate and filling of gaps in the substrate. To achieve high throughput, it is important to minimize the particles or other contaminants so that more substrates can be processed between cleaning.

Chemical vapor deposition (CVD) is a gas reaction process used in the semiconductor industry to form thin layers or films of desired materials on a substrate. Some high density plasma (HDP) enhanced CVD processes use a reactive chemical gas along with physical ion generation through the use of an RF generated plasma to enhance the film deposition by attraction of the positively charged plasma ions onto a negatively biased substrate surface at angles near the vertical to the surface, or at preferred angles to the surface by directional biasing of the substrate surface.

The use of high RF power in HDP-CVD results in improved gapfill, particularly for gaps having a width of equal to or less than about 90 nm and an aspect ratio of at least about 4. For example, the source RF power is at least about 10 kW for processing 200 mm substrates and the source RF power is at least about 12 kW for processing 300 mm substrates. The use of high RF power, however, has been shown to cause an increase in particles, resulting in low throughput.

BRIEF SUMMARY OF THE INVENTION

The present invention is directed to improving defect performance in semiconductor processing systems. In specific embodiments, the invention relates to decreasing the temperature of nozzles in the processing chamber for introducing process gases therein to reduce particles. The source of particles for high power recipes in plasma CVD chambers has been identified by a combination of modeling and experiments. The source of particles is silane ($SiH_4$) pyrolysis due to an increase in nozzle temperature in the plasma at high source RF power levels. This gas phase particle nucleation mechanism produces hydrogenated Si clusters (e.g., $Si_2H_6$) as well as $SiO_2$ particles due to plasma oxidation. Particle SEM plots show spherical particles consistent with gas phase nucleation.

Embodiments of the invention improve defect performance in semiconductor processing systems by decreasing nozzle temperatures in the chamber to impede the gas phase particle nucleation mechanism. This is accomplished by placing a heat shield around one or more nozzles of the gas delivery system. The heat shield is typically a hollow, cylindrical member which extends beyond the tip of the nozzle. The heat shield may be made of aluminum oxide or other ceramic materials.

In accordance with an embodiment of the present invention, an apparatus for processing semiconductor substrates comprises a chamber defining a processing region therein, and a substrate support disposed in the chamber to support a semiconductor substrate. At least one nozzle extends into the chamber to introduce a process gas into the chamber through a nozzle opening. The apparatus comprises at least one heat shield, each of which is disposed around at least a portion of one of the at least one nozzle. The heat shield has an extension which projects distally of the nozzle opening of the nozzle and which includes a heat shield opening for the process gas to flow therethrough from the nozzle opening.

Another embodiment is directed to a heat shield for shielding a nozzle extending into a chamber to introduce a process gas into the chamber through a nozzle opening. The chamber defines a processing region therein and has a substrate support to support a semiconductor substrate for processing in the chamber. The heat shield comprises a hollow member configured to be coupled with the nozzle and having an internal dimension sufficiently large to be disposed around at least a portion of the nozzle. The hollow member has an extension which projects distally of the nozzle opening of the nozzle and which includes a heat shield opening for the process gas to flow therethrough from the nozzle opening.

In accordance with still another embodiment, a method of processing semiconductor substrates comprises placing a substrate on a substrate support in a chamber defining a processing region therein; introducing one or more process gases through at least one nozzle which extends into the chamber and which has a nozzle opening for the one or more process gases to flow therethrough; and applying energy in the processing region to perform a process on the substrate. A heat shield is disposed around at least a portion of the nozzle to reduce a temperature rise of the nozzle from the process performed on the substrate. The heat shield has an extension which projects distally of the nozzle opening of the nozzle and which includes a heat shield opening for the process gas to flow therethrough from the nozzle opening.

DETAILED DESCRIPTION OF THE INVENTION

Figure 1:
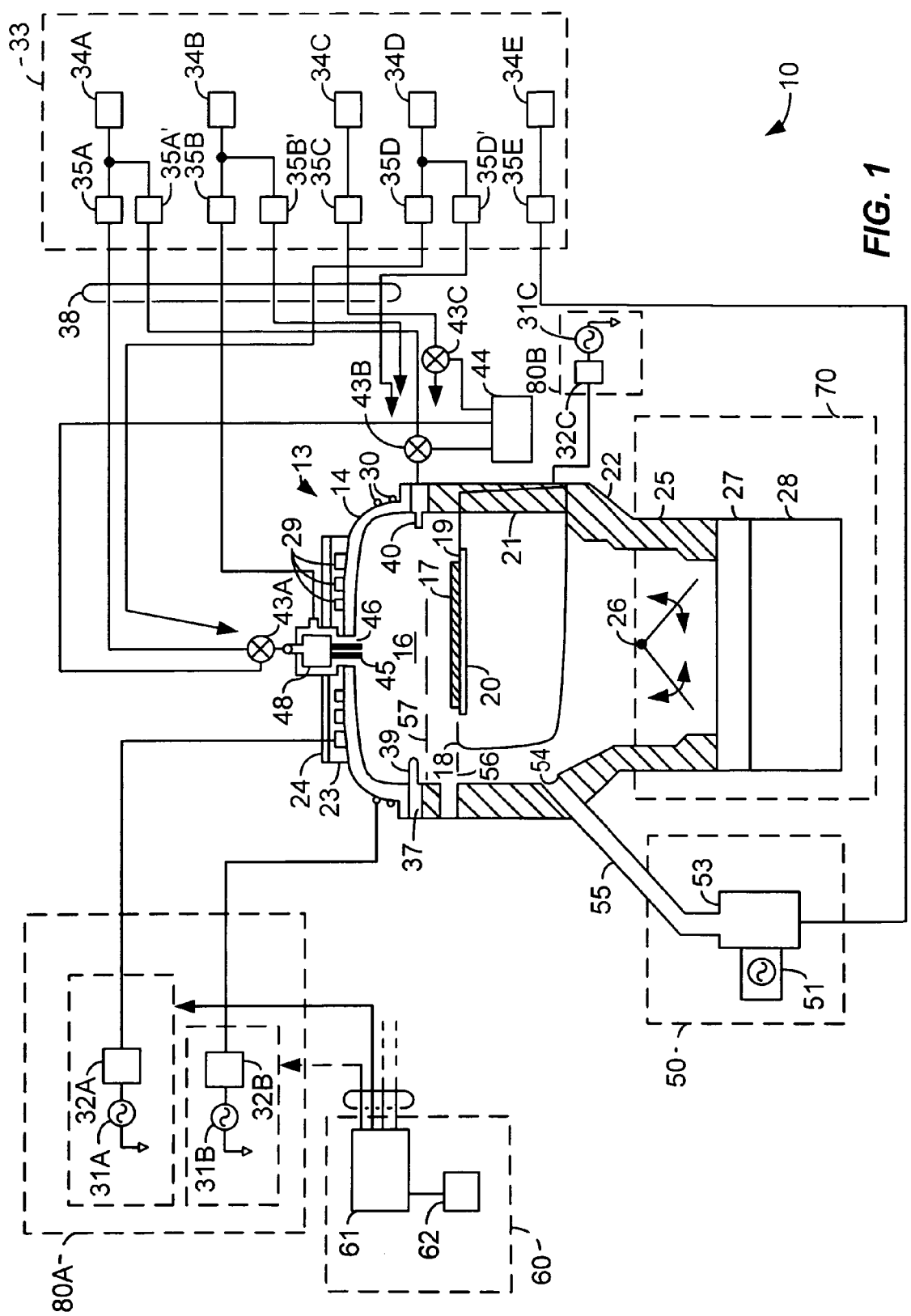
FIG. 1 is a simplified diagram of an embodiment of a high density plasma chemical vapor deposition (HDP-CVD) system according to the present invention.

FIG. 1 illustrates one embodiment of a high density plasma chemical vapor deposition (HDP-CVD) system 10 in which a dielectric layer can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

Generally, exposure to the plasma heats a substrate positioned on substrate support 18. Substrate support 18 includes inner and outer passages (not shown) that can deliver a heat transfer gas (sometimes referred to as a backside cooling gas) to the backside of the substrate.

The lower portion of chamber 13 includes a body member 22, which joins the chamber to the vacuum system. A base portion 21 of substrate support 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support 18. Substrate receiving portion 19 includes an electrostatic chuck 20 that secures the substrate to substrate support 18 during substrate processing. In a preferred embodiment, substrate support 18 is made from an aluminum oxide or aluminum ceramic material.

Vacuum system 70 includes throttle body 25, which houses three-blade throttle valve 26 and is attached to gate valve 27 and turbo-molecular pump 28. It should be noted that throttle body 25 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 milli-Torr to about 2 Torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to about 8,000 watts (7 kW) of RF power or higher at nominally 2 MHz and the side source RF generator 31B provides up to 8,000 watts (5 kW) of RF power or higher at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 8,000 watts of RF power or higher at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition. Other measures may also help stabilize a plasma. For example, the RF control circuit can be used to determine the power delivered to the load (plasma) and may increase or decrease the generator output power to keep the delivered power substantially constant during deposition of a layer.

Figure 2:
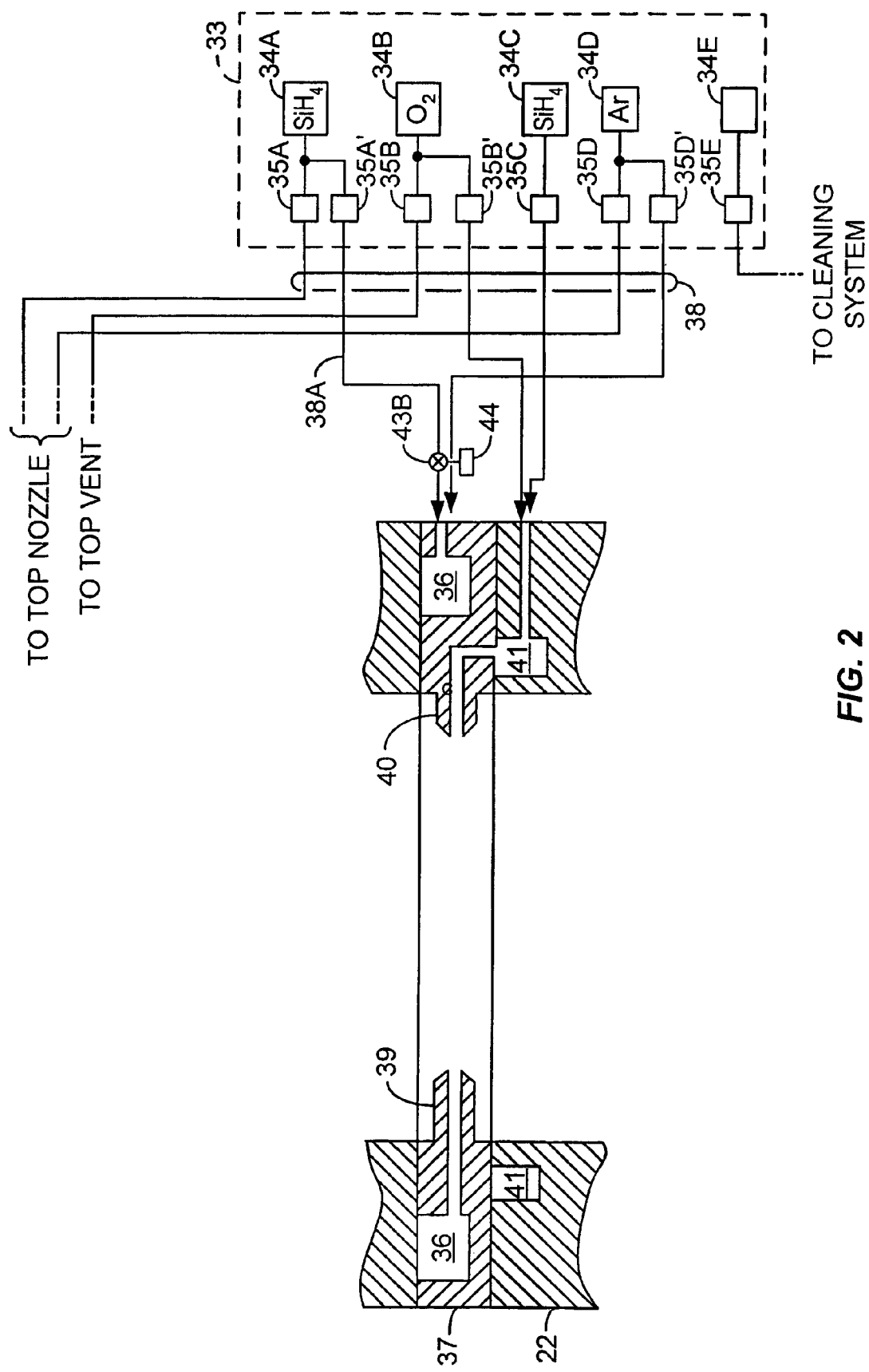
FIG. 2 is a simplified cross section of a gas ring that may be used in conjunction with the exemplary HDP-CVD system of FIG. 1.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 2 is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of gas nozzles 39 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one embodiment, gas ring 37 has 24 gas nozzles 39 made from an aluminum oxide ceramic.

Gas ring 37 also has a plurality of gas nozzles 40 (only one of which is shown), which in a preferred embodiment are co-planar with and the same in length as source gas nozzles 39, and in one embodiment receive gas from body plenum 41. Gas nozzles 39 and 40 are not fluidly coupled in some embodiments where it is desirable not to mix gases before injecting the gases into chamber 13. In other embodiments, gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

In the embodiment shown in FIGS. 1 and 2, remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

Figure 3:
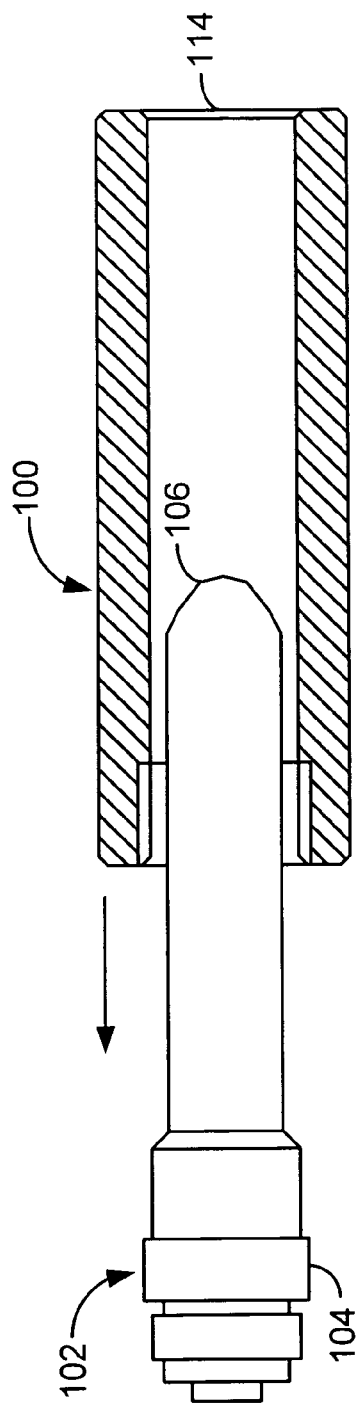
FIGS. 3 and 4 are partial cross-sectional views of a heat shield for a nozzle according to an embodiment of the present invention.
Figure 4:
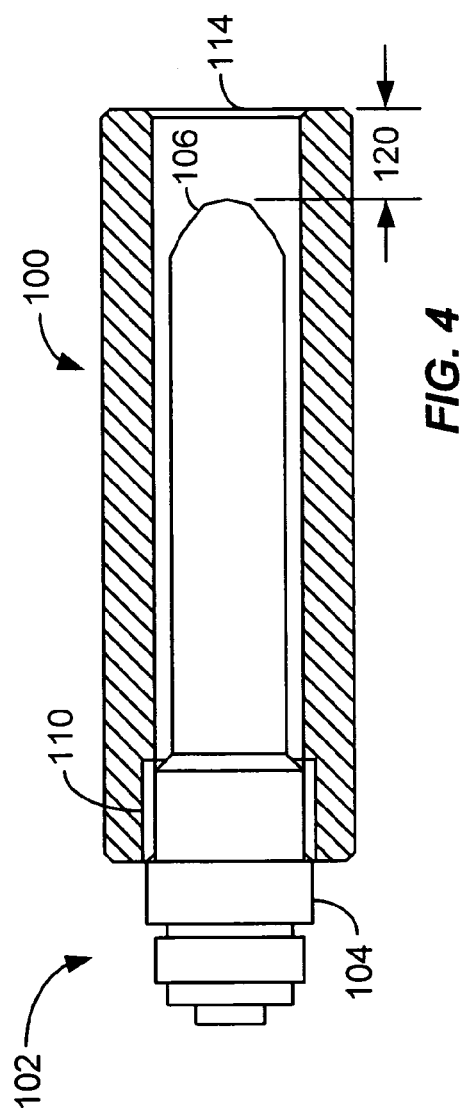

FIGS. 3 and 4 show a heat shield 100 which can be used to shield the nozzle 102 from the heat generated in the CVD chamber by plasma or other energy applied to perform a process in the CVD chamber. The nozzle 102 may be any one of the nozzles 39, 40 shown in FIG. 2. The proximal end 104 of the nozzle 102 is connected to the gas ring 37 (FIG. 2), and the remaining portion of the nozzle 102 is subject to the temperature rise from the energy generated in the chamber. The distal end 106 of the nozzle is typically tapered into a tip, and includes a distal nozzle opening through which one or more process gases flow into the chamber. Due to the low thermal mass at the nozzle tip, the distal end 106 of the nozzle typically experiences the greatest temperature rise due to the energy applied in the chamber. It is desirable to shield the portion of the nozzle 102 exposed inside the chamber, including the distal end 106 of the nozzle.

As shown in FIGS. 3 and 4, the heat shield 100 is configured to be disposed around at least a portion of the nozzle 102, desirably around the entire portion of the nozzle 102 that is exposed in the chamber. The heat shield 100 is typically made of a ceramic material, such as alumina or aluminum oxide, aluminum nitride, silicon carbide, or the like. In specific embodiments, the heat shield 100 and the nozzle 102 are made of the same material, such as aluminum oxide, $Al_2O_3$. The heat shield 100 as shown is a separate piece that is coupled to the nozzle 102, for example, by a threaded connection 110 or the like. Such a heat shield 100 can be conveniently retrofitted onto nozzles in existing CVD chambers. In other embodiments, the heat shield may be formed integrally with the nozzle.

In the embodiment shown, the heat shield 100 has a hollow, cylindrical body, which has an internal dimension sufficiently large to be placed around the nozzle 102. The internal cross-section of the heat shield 100 desirably is slightly larger than the external cross-section of the nozzle 102, as seen in FIG. 4. In the specific embodiment, the gap or spacing between the heat shield 100 and the nozzle 102 is smaller than the thickness of the heat shield 100. The heat shield 100 includes a heat shield opening 114 through which the process gas flows from the nozzle opening. The heat shield 100 preferably includes an extension 120 which projects distally of the nozzle opening at the distal end 106 of the nozzle 102. The length of the extension 120 should be sufficiently large to shield the distal end 106 of the nozzle 102 from the heat in the chamber. The length of the extension 120 should not be so large as to have an adverse effect on the process being performed, such as the uniformity of a layer being formed on the substrate. Moreover, an excessively long extension 120 may produce additional particles. In some embodiments, the length of the extension 120 is between the radius of the nozzle and the diameter of the nozzle 102. In a specific embodiment, the length of the extension 120 is about 0.25 inch, the heat shield 100 has a length of about 1.97 inches, an outer diameter of about 0.635 inch, and a thickness of about 0.153 inch. As shown in FIGS.

1 and 2, the nozzles (39, 40) are disposed around the substrate support. Heat shields 100 may be placed around some or all of the nozzles. In some embodiments, the nozzles and heat shields 100 are configured such that the heat shield openings 114 are disposed radially outwardly of the periphery of the substrate. That is, if the heat shields 100 are projected vertically downward onto the plane of the substrate, the heat shields 100 do not overlap with the substrate.

Although the heat shield 100 as shown has a uniform circular cross-section with a uniform thickness, it is understood that other configurations, shapes, and thickness profiles may be employed in different embodiments.

The heat shield 100 keeps the nozzle temperature relatively low to provide improved particle performance. This allows high power operation in a plasma CVD chamber, for instance, for improved gapfill capability. Due to the improved defect performance, the use of the heat shield allows multi-x clean to be run, thereby improving the throughput of the substrate processing system.

Figure 5:
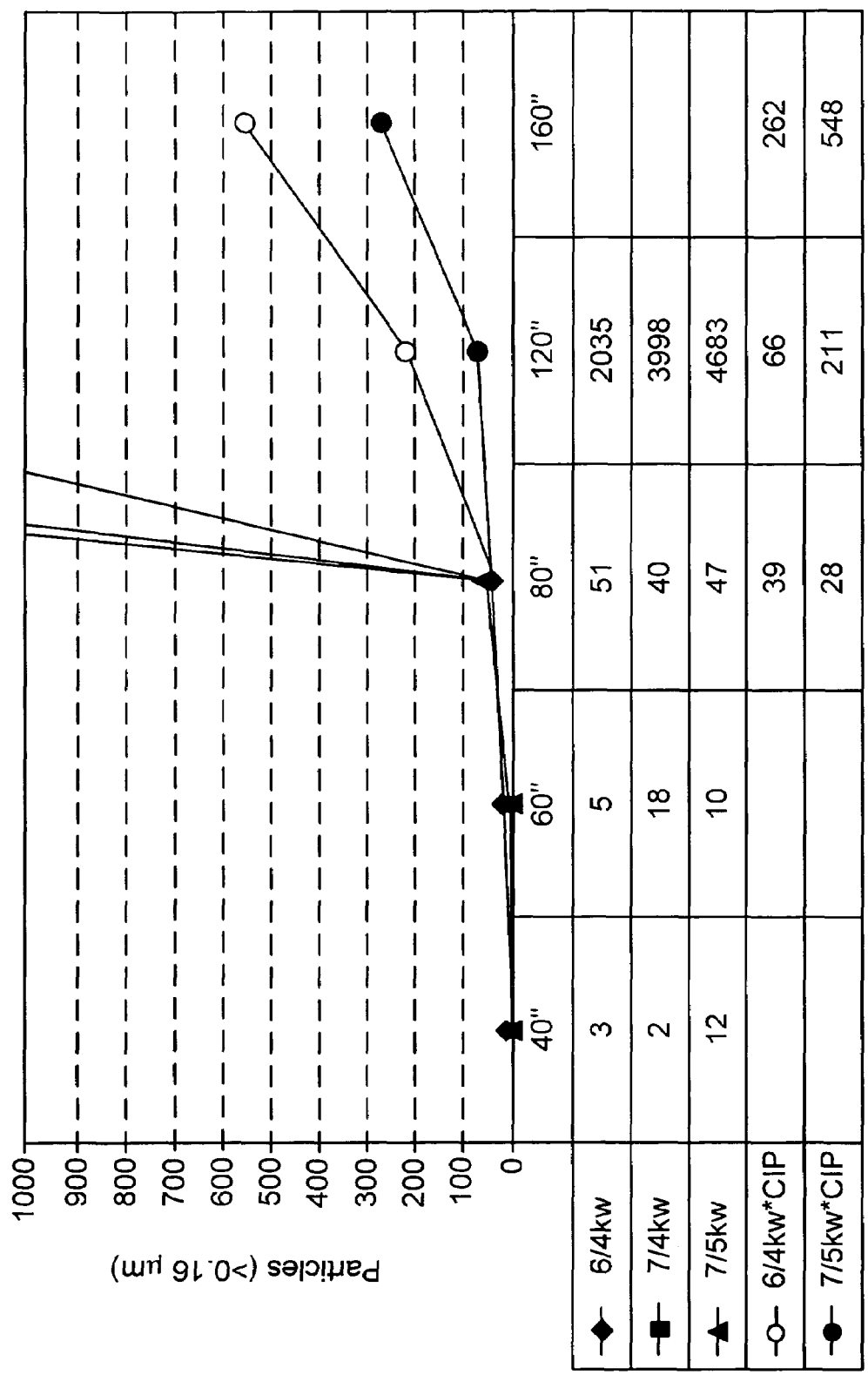
FIG. 5 shows a plot illustrating the time evolution of particles and comparing the experimental results of a CVD system which does not provide heat shields for the nozzles and a CVD system having nozzles with heat shields.

FIG. 5 shows a plot illustrating the time evolution of particles and comparing the experimental results of a CVD system which does not provide heat shields for the nozzles and a CVD system having nozzles with heat shields. The CVD system is similar to the one shown in FIGS. 1 and 2, and the heat shields 100 of FIGS. 3 and 4 are placed on the nozzles 39, 40 disposed around the periphery of the substrate. The particles included in the plot are greater than about 0.16 µm in size. The process involves gapfill of a shallow trench isolation (STI) on a 300 mm silicon substrate having a trench width of about 110 nm and an aspect ratio of about 4:1 by depositing a USG layer from $SiH_4$, $H_2$, and $O_2$. The pressure in the chamber is about 4 mTorr.

The first three experiments were conducted without the heat shield. The source power levels for the top SRF generator (31A) and the side SRF generator (31B) are about 6 kW and 4 kW for the first test, about 7 kW and 4 kW for the second test, and about 7 kW and 5 kW for the third test. As shown in FIG. 5, the particle counts climb rapidly after about 80 seconds at rates that range from about 50 to about 116 particles per second.

The particles increase at a substantially lower rate when the heat shield is used. The two tests employ top and side SRF power levels of about 6 kW and 4 kW, and about 7 kW and 5 kW, respectively. The rates of particle count increase for the two tests, respectively, are about 1 and about 5 particles per second after about 80 seconds, and are about 5 and about 9 particles per second after about 120 seconds.

The present invention is applicable to various processes including STI, IMD (inter-metal dielectric), PSG (phosphosilicate glass), FSG (fluosilicate glass), and the like. In addition to improved gapfill, the invention allows multi-x clean resulting in improved throughput by as much as about 50%. The use of the heat shields results in improved particle performance, thereby allowing high power operation in a plasma CVD chamber, for instance, for improved gapfill capability.

It is to be understood that the above description is intended to be illustrative and not restrictive. Many embodiments will be apparent to those of skill in the art upon reviewing the above description. By way of example, the present invention may extend to other types of thermal as well as plasma deposition chambers and to other processes for processing substrates. The scope of the invention should, therefore, be determined not with reference to the above description, but instead should be determined with reference to the appended claims along with their full scope of equivalents.

What is claimed is:

1. An apparatus for processing semiconductor substrates, the apparatus comprising:
   a chamber defining a processing region therein;
   a substrate support disposed in the chamber to support a semiconductor substrate;
   at least one nozzle extending into the chamber to introduce a process gas into the chamber through a nozzle opening; and
   at least one heat shield, each heat shield disposed around at least a portion of one of the at least one nozzle, the heat shield having an extension which projects distally of the nozzle opening of the nozzle and which includes a heat shield opening for the process gas to flow therethrough from the nozzle opening, the heat shield being spaced from the nozzle by a gap,
   wherein the gap between the heat shield and the nozzle is smaller than a thickness of the heat shield.

2. The apparatus of claim 1 wherein the heat shield comprises a ceramic material.

3. The apparatus of claim 1 wherein the heat shield comprises a material selected from the group consisting of aluminum oxide, aluminum nitride, and silicon carbide.

4. The apparatus of claim 1 wherein the extension of the heat shield projects distally of the nozzle opening by a distance of between about a radius of the nozzle and about a diameter of the nozzle.

5. The apparatus of claim 1 wherein the heat shield is disposed around substantially the entire nozzle extending inside the chamber.

6. The apparatus of claim 1 wherein a plurality of nozzles are disposed around the substrate support and each nozzle has a heat shield disposed around at least a portion thereof.

7. The apparatus of claim 6 wherein the heat shields are disposed around the substrate support and configured such that the heat shield openings of the heat shields are disposed radially outwardly of a periphery of the semiconductor substrate.

8. The apparatus of claim 1 wherein the heat shield comprises a hollow, cylindrical member.

9. The apparatus of claim 1 wherein the heat shield is integrally formed with the nozzle.

10. The apparatus of claim 1 wherein the heat shield is coupled with the nozzle by a threaded connection.

11. A heat shield for shielding a nozzle extending into a chamber to introduce a process gas into the chamber through a nozzle opening, wherein the chamber defines a processing region therein and has a substrate support to support a semiconductor substrate for processing in the chamber, the heat shield comprising:
    a hollow member configured to be coupled with the nozzle and having an internal dimension sufficiently large to be disposed around at least a portion of the nozzle, the hollow member having an extension which projects distally of the nozzle opening of the nozzle and which includes a heat shield opening for the process gas to flow therethrough from the nozzle opening, the hollow member being spaced from the nozzle by a gap which is smaller than a thickness of the hollow member.

12. The heat shield of claim 11 wherein the hollow member is cylindrical and has an internal cross-section which is slightly larger than an external cross-section of the nozzle.

13. The heat shield of claim 11 wherein the hollow member comprises a ceramic material.

14. The heat shield of claim 11 wherein the extension of the heat shield is sized to project distally of the nozzle opening by a distance of between about a radius of the nozzle and about a diameter of the nozzle.

15. The heat shield of claim 11 wherein the heat shield is integrally formed with the nozzle.

16. The heat shield of claim 11 wherein the heat shield is coupled with the nozzle by a threaded connection.

* * * * *